United States Patent [19]

Chiou

[11] Patent Number: 5,502,618
[45] Date of Patent: Mar. 26, 1996

[54] DISSIPATION CASE FOR A POWER SUPPLIER OF DIRECT CURRENT

[76] Inventor: Ming D. Chiou, 3F., No. 4, Alley 11, Lane 327, Sec. 2, Chung Shan Rd., Chung Ho City, Taipei, Taiwan

[21] Appl. No.: 346,046

[22] Filed: Nov. 29, 1994

[51] Int. Cl.⁶ .................................... H05K 7/20
[52] U.S. Cl. .................. 361/695; 307/150; 361/707; 361/714; 361/715
[58] Field of Search ............................ 307/150; 361/688, 361/690–697, 704, 707, 709, 711, 714–718, 722, 730, 752

[56] References Cited

U.S. PATENT DOCUMENTS

| | | | |
|---|---|---|---|
| 3,582,714 | 6/1971 | Shmurak | 361/714 |
| 4,639,834 | 1/1987 | Mayer | 361/690 |
| 4,707,763 | 11/1987 | Kudo | 361/704 |
| 5,170,336 | 12/1992 | Getter et al. | 361/697 |
| 5,258,888 | 11/1993 | Korinsky | 361/690 |

FOREIGN PATENT DOCUMENTS 6077677  3/1994  Japan ..................... 361/697

*Primary Examiner*—Gregory D. Thompson
*Attorney, Agent, or Firm*—Pro-Techtor International

[57] ABSTRACT

A heat dissipating case for a DC power supplier. The case includes multiple integral heat sinks, and a receptacle filled with thermal silicon rubber for the transformer. A base of the case is formed from cast aluminum.

4 Claims, 3 Drawing Sheets

DISSIPATION CASE FOR A POWER SUPPLIER OF DIRECT CURRENT

The present invention relates to a dissipation case for a power supplier of direct current to access the dissipation efficiency of heat.

BACKGROUND OF THE INVENTION

A conventional power supplier of direct current such as that used in a portable personal computer is provided with a power diode and a transformer which are arranged in a plastic case. Usually, the heat generated by the diode is dissipated by using a heat sink attached on the diode, but an unfavorable dissipation efficiency is attained due to an insufficient area of cooling in the heat sink. Although a better dissipation efficiency may be achived by means of increasing the dimension of the heat sink, it in turn results in an increased dimension of the power supplier and the problem arises that the power supplier may not be carried handily.

SUMMARY OF THE INVENTION

The crux of the invention resides in the fact that a dissipation case is made of cast aluminum alloy with a plurality of air passages formed in the case to communicate with an electric fan, and heat sinks on the diode is positioned in these air passages to perform a heat dissipation efficiently.

An object of the present invention is to provide a dissipation case for a power supplier of dirct current which is made of cast aluminum alloy with a larger cooling surface.

Another object of the present invention is to provide a dissipation case for a power supplier of direct current which is able to shorten the time for heat dissipation in heat sinks.

A further object of the present invention is to provide a dissipation case for a power supplier of direct current which allows a smaller size of the direct current power supplier and a greater power of the transistor.

BRIEF DESCRIPTION OF THE DRAWINGS

The present invention will be further described in detail, by way of example, with reference to accompanying drawings in which.

DESCRIPTION OF THE PREFERRED EMBODIMENT

Figure 1:
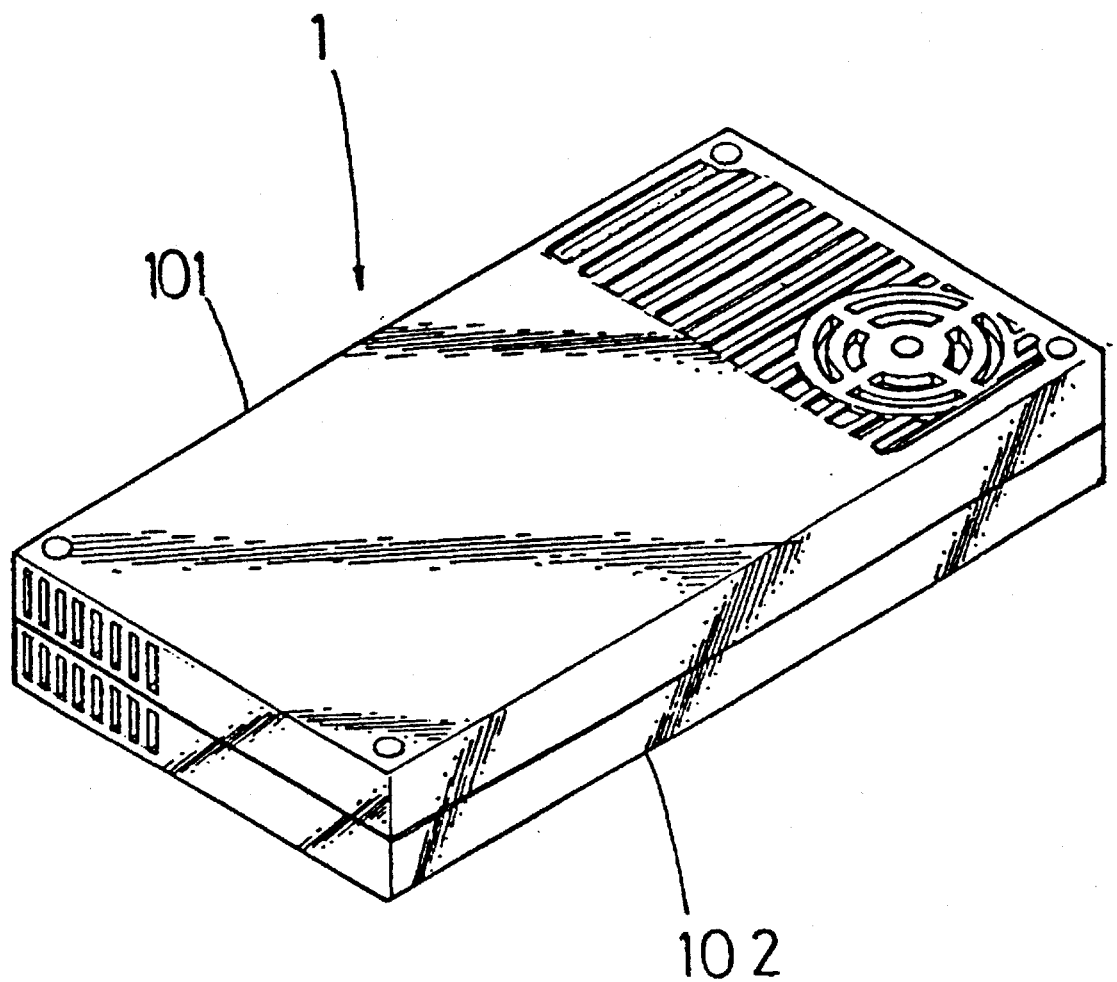
FIG. 1 is a perspective view of a dissipation case for a preferred embodiment of the present invention.
Figure 2:
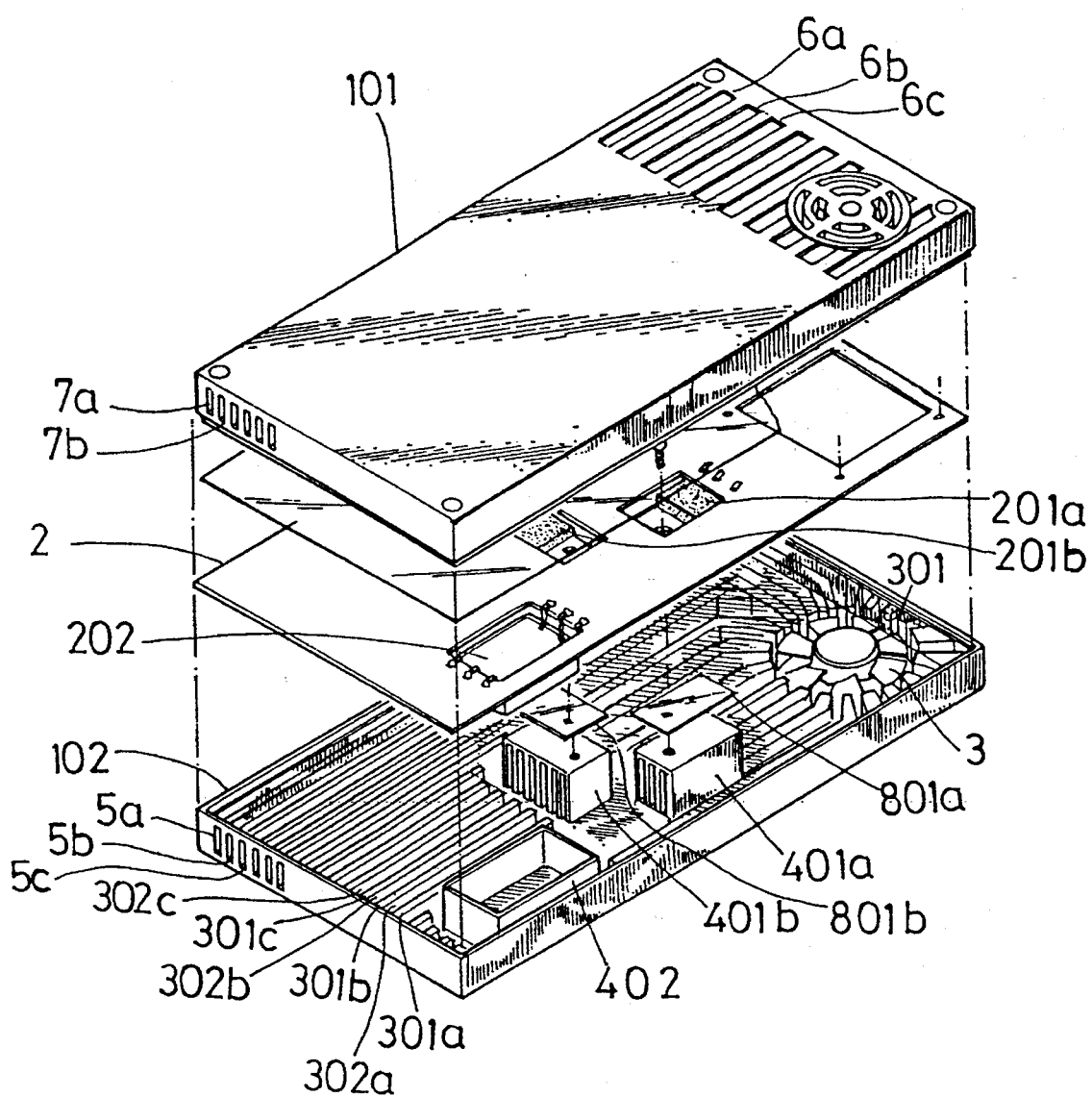
FIG. 2 is a perspective exploded view of FIG. 1 showing a printed circuit board and electronic parts receiving in the dissipation case.

By reference to FIG. 1 and FIG. 2 firstly, the dissipation case 1 consists of an upper cover 101 and a base cover 102 and at least the base cover 102 is made of cast aluminum alloy.

A prior art printed circuit board 2 which acts to convert the alternating current into the direct current is received in the inner space of the base cover. Power transistors 201a, 201b, the transformer 202 and related wirings provided on the printed circuit board 2 are well known in the art so that they will not be described in detail here.

Figure 3:
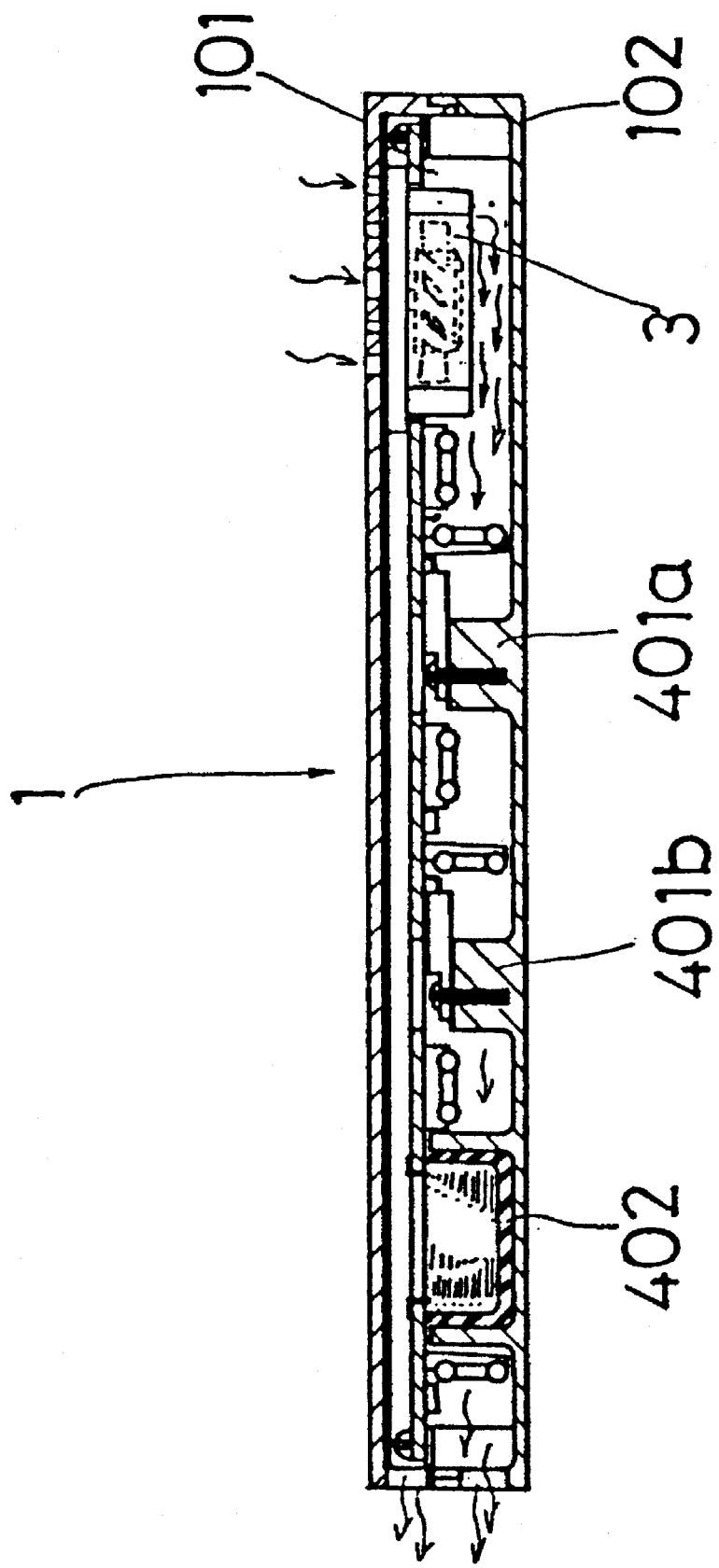
FIG. 3 is a sectional view of FIG. 1 along a longitudinal dirction showing air passages and indicating the direction of air flow.

Referring to FIGS. 2 and 3, the interior of the base cover 102 is formed a plurality of longitudal guide walls 301a, 301b, 301c, ... to costitute a plurality of air passages 302a, 302b, 302c, ... with an end part communicating with a recess room 301 located at the right end of the base cover 102 for placing an electric fan 3 and the other end communicating with the outside air via a plurality of ventilation openings 5a, 5b, 5c, ... at the left end wall of the base cover 102. Furthermore, the base cover 102 is integrated with heat sinks 401a, 401b and a receiving chamber 402 to correspond respectively to power transistors 201a, 201b and the transformer 202 on the printed circuit board 2.

The upper cover 101 is provided with a plurality of air inlets 6a, 6b, 6c, ... at the right end and with a plurality of ventilation openings 7a, 7b, ... at the left end wall.

As shown in FIG. 2, before the printed circuit board 2 is fixing to the base cover 102, insulators 801a, 801b are laid on heat sinks 401a, 401b respectively in advance so that a thermal silicon rubber of anti high temperature and anti high voltage can be poured into the receiving chamber 402 to fixing the printed circuit board 2 onto the base cover 102. The heat generated from power transistors 201a, 201b can be transmitted to the greater dissipating surface on the case 1 through heat sinks 401a, 401b integrated with the base cover. Similarly, the heat generated from the transformer 202 can be transmitted to the greater dissipating surface on the case 1 through the silicon rubber and the receiving chamber 402 integrated with the base cover 102. In addition, the cooling air introduced by the fan 3 is forced to pass through air passages 302a, 302b, 302c ... to carry away the heat in heat sinks 401a, 401b and in the receiving chamber 402 so as to shorten the time of heat dissipation.

I claim:

1. A dissipation case for a power supplier of direct current comprising:

an upper cover, a base cover which is made of cast aluminum alloy with an open surface closed by said upper cover to form an inner space, a printed circuit board which comprises a plurality of power transistors, a transformer and related wirings and is located in said inner space to convert alternating current into direct current along with a voltage drop; wherein a plurality of heat sinks integral to said base cover are in communication with said power transistors and a receiving chamber with thermal silicon rubber therein is provided on said base cover to receive said transformer.

2. A dissipation case for a power supplier of direct current according to claim 1 wherein said upper cover is made of cast aluminum alloy.

3. A dissipation case for a power supplier of direct current comprising:

an upper cover, a base cover which is made of cast aluminum alloy with an open surface closed by said upper cover to form an inner space, a printed circuit board which comprises a plurality of power transistors, a transformer and related wirings and is located in said inner space to convert alternating current into direct current along with a voltage drop; wherein a plurality of longitudinal guide walls integral to said base cover form a plurality of air passages with an end part communicating with a recess area for a fan and the other end part communicating with outside air through a plurality of ventilation openings located at an end wall of said base cover so that a plurality of heat sinks are formed and are in communication with said transistors; and a receiving chamber with thermal silicon rubber therein is provided on said base cover to receive said transformer.

4. A dissipation case for a power supplier of direct current according to claim 3 wherein said upper cover is made of cast aluminum alloy.

* * * * *